United States Patent [19]
Lee et al.

[11] Patent Number: 5,349,216
[45] Date of Patent: Sep. 20, 1994

[54] CHARGE COUPLED DEVICE IMAGE SENSOR

[75] Inventors: Seo K. Lee, Sungnam; Uja Shinji, Kwacheon, both of Rep. of Korea

[73] Assignee: Gold Star Electron Co., Ltd., Chungcheongbuk, Rep. of Korea

[21] Appl. No.: 76,336

[22] Filed: Jun. 11, 1993

[30] Foreign Application Priority Data

Jun. 12, 1992 [KR] Rep. of Korea ............ 10236/1992

[51] Int. Cl.$^5$ .................. H01L 29/78; H01L 27/14; H01L 31/00
[52] U.S. Cl. ....................... 257/230; 257/223; 257/233; 257/249; 257/445; 348/299
[58] Field of Search ............ 257/223, 229, 230, 233, 257/249, 445; 358/213.19

[56] References Cited

U.S. PATENT DOCUMENTS

| 4,831,426 | 5/1989 | Kimata et al. | 357/24 |
| 4,982,252 | 1/1991 | Matsunaga | 257/229 |
| 5,118,631 | 6/1992 | Dyck et al. | 457/29 |
| 5,238,864 | 8/1993 | Maegawa et al. | 437/53 |
| 5,288,656 | 2/1994 | Kusaka et al. | 437/53 |

FOREIGN PATENT DOCUMENTS

| 60-89967 | 5/1985 | Japan | 257/229 |
| 3-16264 | 1/1991 | Japan | 257/223 |

*Primary Examiner*—Ngan Van Ngo
*Attorney, Agent, or Firm*—Faegre & Benson

[57] ABSTRACT

A CCD image sensor comprising: a semiconductor substrate of a first conductivity type connected to a ground; an impurity region of a second conductivity type formed in the surface of the semiconductor substrate of the first conductivity type, to serve as a blooming prevention layer; an impurity region of the first conductivity type formed in the surface of the semiconductor substrate, so that it encloses the impurity region of the second conductivity type serving as a blooming prevention layer, to serve as a potential barrier layer; an impurity region of the second conductivity type formed in the surface of the semiconductor substrate of the first conductivity type so that it encloses the impurity region of the first conductivity type serving as a potential barrier layer, to serve as a light receiving region; an insulation film which is formed on the surface of the semiconductor substrate of the first conductivity type and has contact holes at both edges of the impurity region of the second conductivity type, serving as a blooming prevention layer; silicide films filled in the contact holes; and a light shield conductor film which is formed on the surface of the remaining insulation film, except for a portion between the silicide films and the surfaces of the silicide films, and is connected to a voltage source.

5 Claims, 4 Drawing Sheets

CHARGE COUPLED DEVICE IMAGE SENSOR

BACKGROUND OF THE INVENTION

The present invention relates to a charge coupled device image sensor and a method of making the same.

A charge coupled device (CCD) image sensor essentially comprises a light receiving region for receiving light and generating a signal charge in response to the received light, and a signal charge transfer region for transferring the generated signal charge in a single direction.

However, the light receiving region generally generates excess signals charge when too much light is incident on the light receiving region.

The excess signal charge causes a blooming phenomenon to be generated on a screen.

When a signal charge in excess of necessary signal charges is moved from the light receiving portion to the signal charge transfer region, this phenomenon is referred to as an over flow drain (OFD).

Conventionally, the light receiving region of CCD image sensor has a structure for preventing the OFD phenomenon.

The structure of the light receiving region for preventing the OFD phenomenon may generally be classified into a lateral structure and a vertical structure.

At present it is preferable to use the vertical structure, as the size of the light receiving region is reduced in accordance with the high integration of CCD image sensor.

Referring to FIG. 1, there is shown a section of a conventional CCD image sensor which has a light receiving region of the vertical structure to prevent the OFD phenomenon.

As shown in FIG. 1, the conventional CCD image sensor comprises: a silicon substrate 1 of n-type;
a well 2 of p-type formed in the surface of the silicon substrate 1; a first insulation film 3 formed on the surface of the well 2;
a signal charge transfer region 4 of n-type formed in the surface of the well 2; a surface layer 5 of p+-type (+denotes a high concentration) spaced from the signal charge transfer region 4 with a constant distance, for applying an initial bias;
a light receiving region 6 of n-type formed beneath the surface layer 5 of p+-type; a first electrode 7 formed on the surface of the first insulation film 3 which is corresponding to the upper part of the signal charge transfer region 4; a second insulation film 8 formed on the surface of the first electrode 7;
a second electrode 9 formed on the surface of the second insulation film 8 and the surface of the first insulation film 3 which is located between the signal charge transfer region 4 of n-type and the light receiving region 6 of n-type;
a third insulation film 10 formed on the surface of the second electrode 9; and
a light shield layer 11 formed on the surface of the first insulation film 3 and the third insulation film 10 except for the upper portion of the light receiving region 6 of n-type.

Herein, the well 2 of p-type comprises a shallow well 2a and a deep well 2b to prevent a smear phenomenon.

The smear phenomenon means that a part of signal charges generated from a light receiving region corresponding to a pixel are mixed with signal charges generated from another light receiving region corresponding to another pixel, and then moved to the light receiving region of n-type, corresponding to the other pixel.

Consequently, the smear phenomenon makes it impossible to correctly display an image on a screen and moreover reduces the resolution of the screen.

The operation of the CCD image sensor shown in FIG. 1 will hereinafter be described briefly in conjunction with FIG. 1.

First, when light corresponding to an image signal is incident, the light receiving region 6 generates signal charges corresponding to the image signal.

At this time, if too much light is incident on the light receiving region 6, the light receiving region 6 of n-type generates unnecessary excess signal charges in excess of the signal charges corresponding to the image signal.

At this time, if a bias is applied to the silicon substrate 1 of n-type which is connected to a voltage source Vd, the saddle point of potential taken on the line A—A' is then lowered toward the silicon substrate 1 of n-type by a predetermined height.

Therefore, the excess signal charges flow toward the silicon substrate 1, thereby enabling the OFD phenomenon and the smear phenomenon to be reduced.

However, the above-conventional technique has the following disadvantages.

Firsts the time for making a CCD image sensor is increased and the method of making a CCD image sensor is complicated, since a p-type well is essentially formed to prevent the OFD phenomenon.

Second, it is easy for the smear phenomenon to be generated and quantum efficiency is lows since the characteristic of long wavelength is not good.

SUMMARY OF THE INVENTION

Therefore, the present invention has been made in view of the above problem, and it is an object of the present invention to provide a CCD image sensor and a method of making the same, in which the process of making it can be more simplified, the characteristic of long wave length can be improved and a smear characteristic can be avoided.

To achieve this object, the present invention uses a substrate of p-type instead of a substrate of n-type and also moves the excess signal charges from the light receiving regions toward the surface side of the substrate by applying a bias to the surface of the substrate, instead of moving the excess signal charges from the light receiving region toward the lower portion of the substrate as was explained above for the prior art.

In accordance with one aspect of the present invention, there is provided a CCD image sensor comprising:
a semiconductor substrate of a first conductivity type connected to a ground;
an impurity region of a second conductivity type formed in the surface of the semiconductor substrate of the first conductivity type, to serve as a blooming prevention layer;
an impurity region of the first conductivity type formed in the surface of the semiconductor substrate, so that it encloses the impurity region of the second conductivity type serving as a blooming prevention layer, to serve as a potential barrier layer;
an impurity region of the second conductivity type formed in the surface of the semiconductor substrate of the first conductivity type, so that it encloses the impurity region of the first conductivity type serving as a potential barrier layer, to serve as a light receiving region;

an insulation film which is formed on the surface of the semiconductor substrate of the first conductivity type and has contact holes at both edges of the impurity region of the second conductivity type, serving as a blooming prevention layer;

silicide films filled in the contact holes; and a light shield conductor film which is formed on the surface of the remaining insulation film, except for a portion between the silicide films and the surfaces of the silicide films, and is connected to a voltage source.

In accordance with another aspect of the present invention, there is provided a method of making a CCD image sensor, comprising the steps of:

forming a first insulation film on the whole surface of a semiconductor substrate of a first conductivity type;

implanting impurity ions of the first conductivity type having a concentration higher than that of the semiconductor substrate in the semiconductor substrate of the first conductivity type, thereby forming a first channel stop region and a second channel stop region of the first conductivity type spaced from each other with a constant distance in the surface of the semiconductor substrate;

implanting impurity ions of a second conductivity type in the semiconductor substrate of the first conductivity type, thereby forming a signal charge transfer region of the second conductivity type contacted with the first channel stop region, in the semiconductor substrate of the first conductivity type;

forming a conductor on the whole surface of the first insulation film and patterning the conductor, thereby forming a first electrode in the upper portion of the signal charge transfer region;

forming a second insulation film on the whole surfaces of the first electrode and the first insulation film, and patterning the second insulation film, thereby allowing only a portion of the second insulation film which is formed on the surface of the first electrode to remain;

forming a conductor on the whole surface of the remaining second insulation film and the first insulation film and patterning the conductor, thereby allowing only a portion of the conductor which is formed on the surface of the remaining second insulation film to remain, as a second electrode;

implanting impurity ions of the second conductivity type in the semiconductor substrate of the first conductivity type, thereby forming a light receiving region of the second conductivity type in the surface of the semiconductor substrate between the second channel stop region and the lower portion of the second electrode;

implanting impurity ions of the first conductivity type in the light receiving region of the second conductivity type, thereby forming a potential barrier layer of the first conductivity type in the light receiving region of the second conductivity type;

implanting impurity ions of the second conductivity type having a concentration higher than that of the light receiving region in the potential barrier layer of the first conductivity type, thereby forming a blooming prevention layer of the second conductivity type; forming a third insulation film on the whole surfaces of the first insulation film and the second electrode and patterning the third insulation film, thereby allowing to remain only a portion of the third insulation layer which is formed on the surface of the second electrode;

patterning the first insulation film, thereby forming contact holes respectively at both edge portions of the blooming prevention layer of the second conductivity type; filling the contact holes with a metal having a high melting point;

annealing the metal filled in the contact holes, thereby converting the metal into a silicide film;

forming a conductor on the whole surfaces of the first insulation film, the third insulation film and the silicide films and patterning the conductor so that only a portion between the silicide films can be removed, thereby forming a light shield conductor layer; and forming a protection film on the exposed whole surfaces of the first insulation film and the light shield conductor layer.

DETAILED DESCRIPTION OF THE INVENTION

Hereinafter, the present invention will be described in detail in conjunction with FIGS. 3 to 5.

Figure 1:
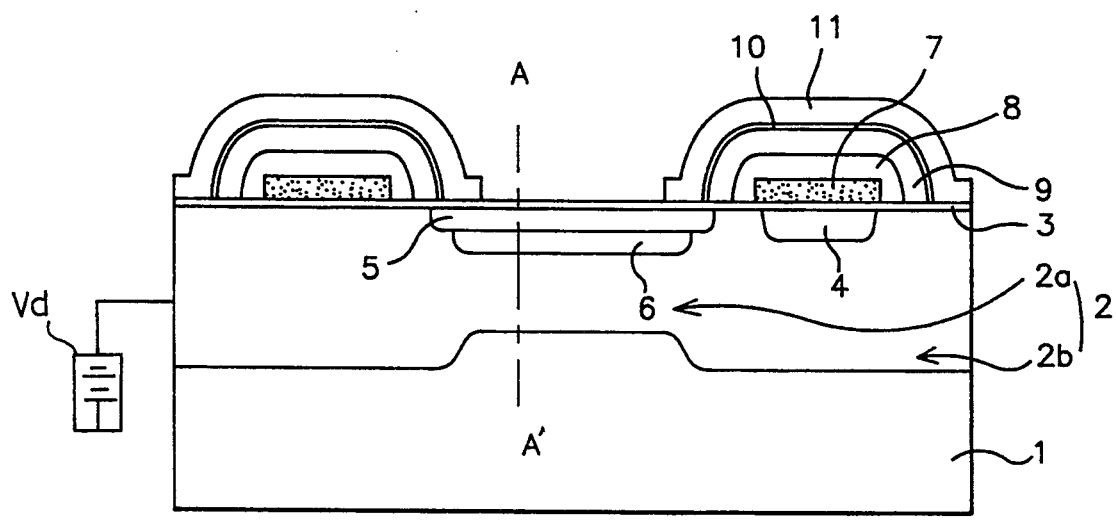
FIG. 1 is a sectional view showing the structure of a conventional CCD image sensor.
Figure 2:
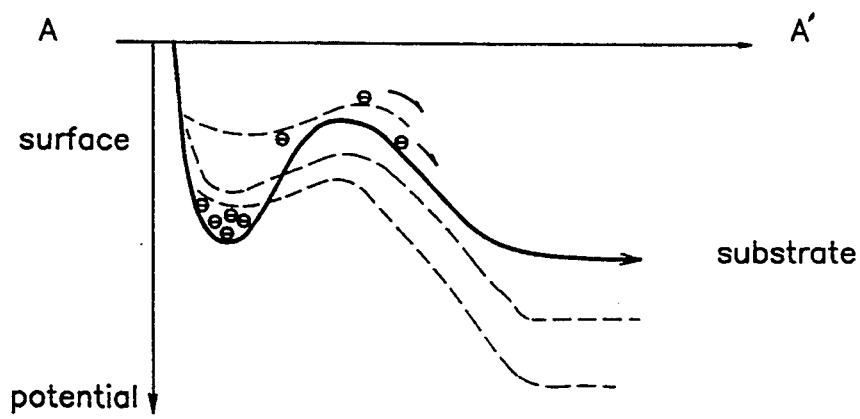
FIG. 2 is a diagram showing a potential profile taken on the line A—A' of FIG. 1.
Figure 3:
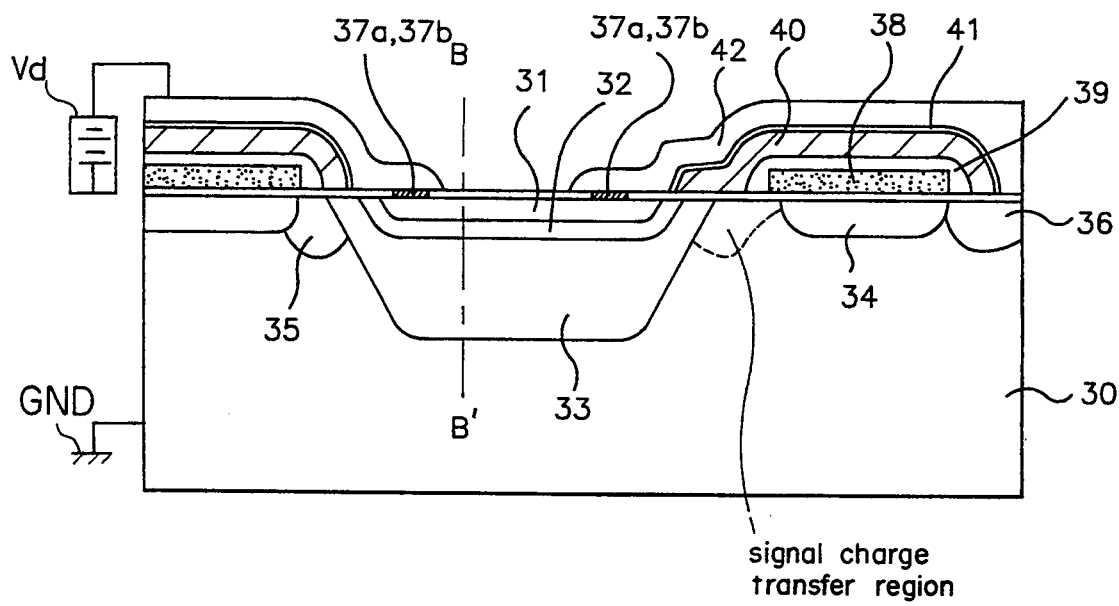
FIG. 3 is a sectional view showing the structure of a CCD image sensor in accordance with the present invention.

Referring to FIG. 3, there is illustrated a sectional view showing the structure of a CCD image sensor in accordance with the present invention.

As shown in FIG. 3, the CCD image sensor comprises: a silicon substrate 30 of p-type; an impurity layer 31 of n+-type (herein, + denotes a high concentration) formed beneath the surface of the silicon substrate 30, serving as a blooming prevention layer; an impurity layer 32 of p—type (herein, - denotes a low concentration) formed in the silicon substrate 30 of p-type, corresponding to the lower portion of the impurity layer 31 of n+-type, so that the impurity layer 32 of p-type encloses the impurity layer 31 of n+-type, serving as a potential barrier layer;

an impurity layer 33 of n-type formed in the silicon substrate 30 of p-type, corresponding to the lower portion of the impurity layer 32 of p-type, so that the impurity layer 33 of n-type encloses the impurity layer 32 of p-type, serving as a light receiving region; an impurity layer 34 of n-type formed in the silicon substrate 30 of p-type, so that one side of the impurity layer 34 is spaced from one side of the impurity layer 33, serving as a signal charge transfer region;

two impurity regions 35,36 of p+-type formed at the other sides of the impurity region 33 and the impurity region 34 of n-type, respectively, serving as a channel stop region;

an insulation film 37 which is formed on the surface of the silicon substrate 30 of p-type and has contact holes 37a at both edge portions of the impurity region 31 of n+-type, respectively, serving as a blooming prevention layer;

conductor films 37b filled in the contact holes 37a, respectively; a first electrode 38 formed on the surface of the insulation film 37 corresponding to the upper portion of the impurity layer 34 of n-type serving as a signal charge transfer region; an insulation film 39 formed on the first electrode 38 so that it encloses the exposed surface of the first electrode 38;

a second electrode 40 formed on the insulation film 39, 37 so that it covers the exposed surface of the insulation film 39 and the surface of the insulation film 37 corresponding to between the surface of the light receiving region 33 and the surface of the signal charge transfer region;

an insulation film 41, formed so that it covers the exposed surface of the second electrode 40; and an optical shield conductor layer 42, formed on the insulation film 41, the conductor films 37b and the remaining part of the insulation film 37, except for a portion between the contact holes 37a, connected to a voltage source Vd and electrically connected to the impurity layer 31 of n+-type via the conductor films 37b.

Herein, the optical shield conductor layer 42 is made of either a metal or a conductive polysilicon and the conductor films 37b are made of a silicide.

Also, the doping concentrations of p-type and n-type are higher than that of p-type and n-type and lower than that of p+-type and n+-type, respectively.

Hereinafter, the operation of the CCD image sensor shown in FIG. 3 will be described briefly.

As shown in FIG. 3, the silicon substrate 30 is connected to the ground GND and the light shield conductor layer 42 is connected to the voltage source Vd.

Figure 4:
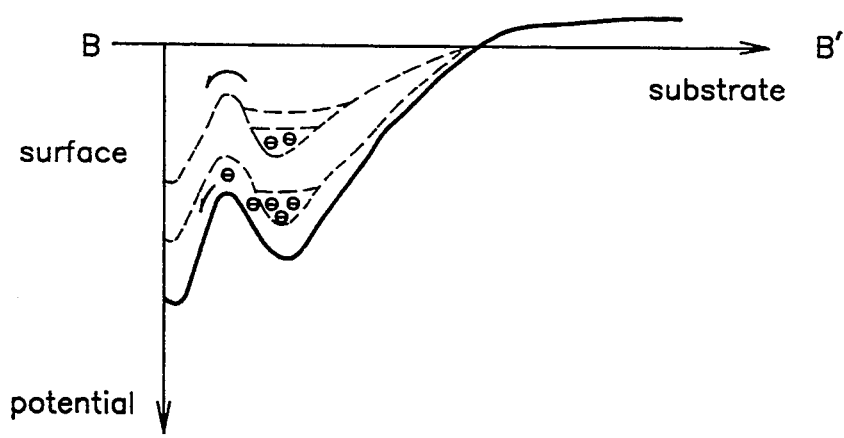
FIG. 4 is a diagram showing a potential profile taken on the line B—B' of FIG. 3.

Therefore, upon applying a bias from the voltage source Vd into the light shield conductor layer 42, the potential is largely lowered at the surface of the silicon substrate 30 of p-type as shown in FIG. 4, as compared with other portions.

At this time, the impurity layer 33, serving as a light receiving region, generates signal charges in response to incident light.

Excess signal charges of the generated signal charges flow toward the ground GND via the conductor films 37b and the light shield conductor layer 42.

As above mentioned, the blooming phenomenon can be restrained, since the excess signal charges flow toward the surface of the silicon substrate 30 of p-type.

As shown in FIG. 4, it is possible to embody a CCD image sensor of high sensitivity since the potential is formed relatively higher than that of other portions at the bulk portion of p-type silicon substrate 30.

Hereinafter, the method of making the CCD image sensor shown in FIG. 3 will be described in detail in conjunction with FIGS. 5a to 5g.

Figure 5A:
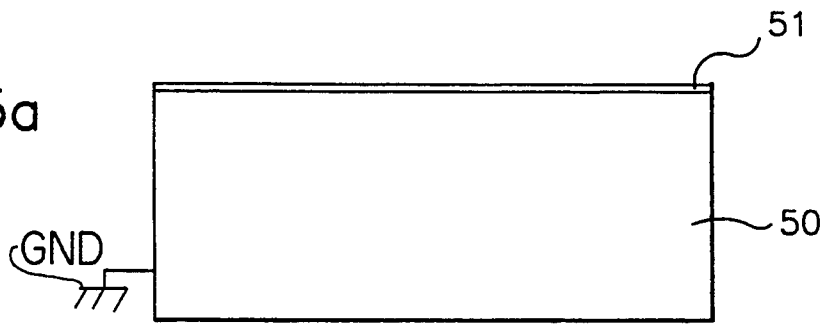
FIGS. 5a to 5g are sectional views illustrating a method of making a CCD image sensor in accordance with the present invention.

First, a first insulation film 51 is formed on the whole surface of a p-type silicon substrate 50 as shown in FIG. 5a.

Figure 5B:
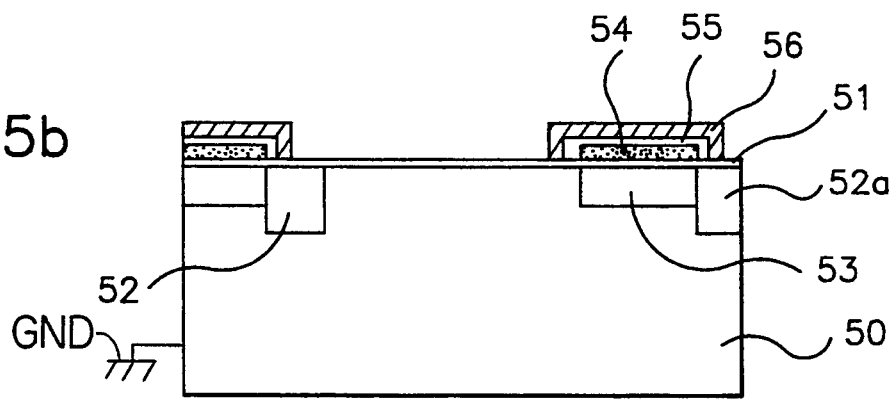

Subsequently, p+-type impurity ions are implanted in the p-type silicon substrate 50, thereby to form a first p+-type channel stop region 52 and a second p+-type channel stop region 52a spaced from each other with a constant distance in the surface of p-type silicon substrate 50, as shown in FIG. 5b.

Thereafter, n-type impurity ions are implanted in the p-type silicon substrate 50, thereby forming an n-type signal charge transfer region 53 in contact with the first channel stop region 52, in the surface of the p-type silicon substrate, corresponding to a portion between the first p+-type channel stop region 52 and the second p+-type channel stop region 52a.

Thereafter, a conductive polysilicon is deposited on the surface of the first insulation film 51, as a conductor, using a chemical vapor deposition (CVD) method and then the polysilicon is patterned to form a first electrode 54 on the first insulation film 51 corresponding to the upper portion of the n-type signal charge transfer region 53.

Subsequently, an insulation film is deposited on the exposed whole surface of the p-type silicon substrate 50 and the first electrode 54 using a CVD method and the insulation film is patterned to form a second insulation film 55, which covers the surface of the first electrode 54.

Subsequently, a polysilicon is deposited on the exposed whole surface of the p-type silicon substrate 50 and the second insulation film 55 using a CVD method and then the polysilicon is patterned, thereby forming a second electrode 56 which covers the surface of the second insulation film 55.

Figure 5C:
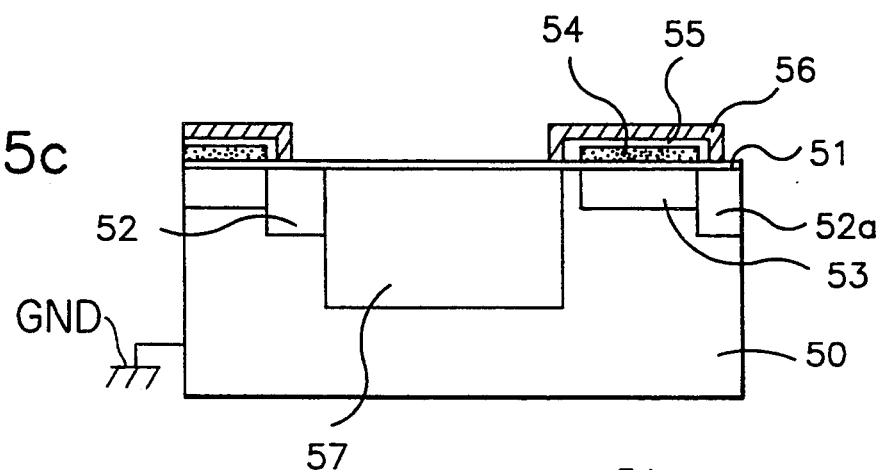

Thereafter, n-type impurity ions are implanted in the p-type silicon substrate 50, forming an n-type light receiving region 57 spaced from the n-type signal charge transfer region 53 with a constant distance, in the surface of the p-type silicon substrate 50 between the second p+-type channel stop region 52a and the lower portion of the second electrode 56, as shown in FIG. 5c.

Figure 5D:
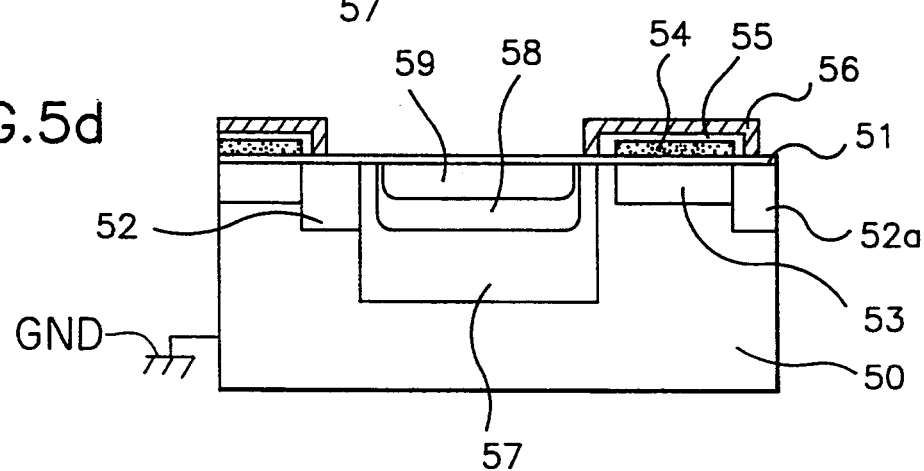

As shown in FIG. 5d, subsequently p-type impurity ions are implanted in the n-type light receiving region 57 to form a p-type barrier region 58 in the n-type light receiving region 57 and then n+-type impurity ions are implanted in the p-type barrier region 58 to form an n+-type impurity region 59 in the p-type barrier regions 58.

The n+-type impurity region 59 makes it possible to move the excess signal charges toward the ground GND, thereby enabling the blooming phenomenon to be prevented.

Figure 5E:
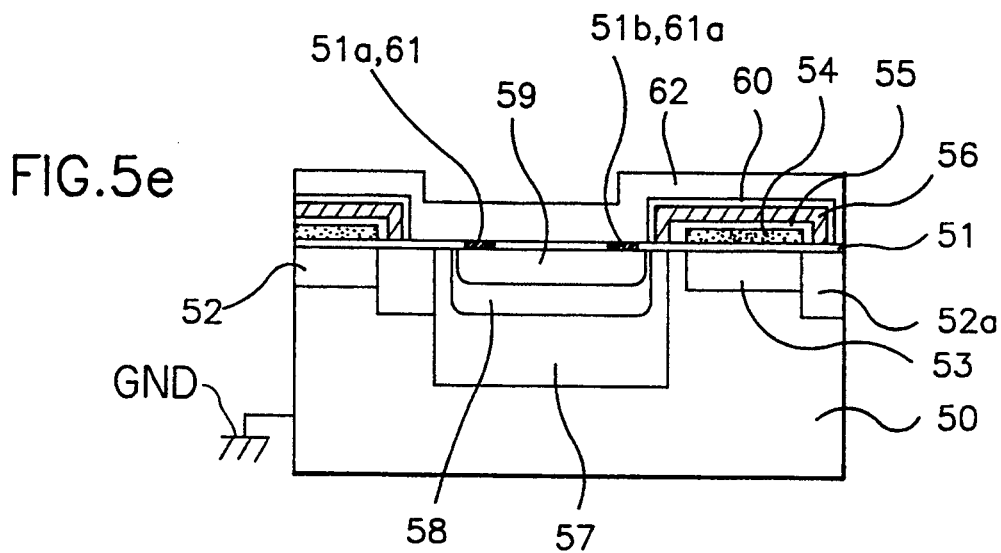

Thereafter, an insulator is deposited on the exposed whole surface of the second electrode 56 and the first insulation film 51 using a CVD method and then the insulator is patterned to form a third insulation film 60 which covers the surface of the second electrode 56, as shown in FIG. 5e.

The first insulation film 51 is then patterned to form contact holes 51a, 51b at both edges of the n+-type impurity region 59, respectively.

Subsequently, a metal having a high melting point is deposited in the contact holes 51a, 51b so that the metal fills the contact holes 51a, 51b.

The metal having a high melting point is then subjected to an annealing process to convert the metal into silicide films 61, 61a, respectively.

Subsequently, a conductor 62 is deposited on the exposed whole surfaces of the first insulation film 51, the third insulation film 60 and the silicide films 61,61a by using a CVD method.

Figure 5F:
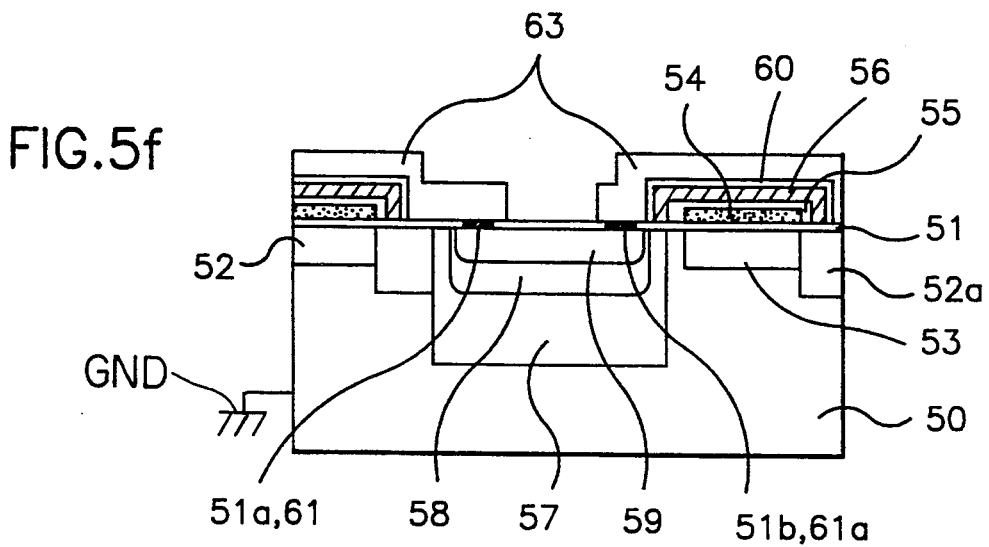

As shown in FIG. 5f, the conductor 62 is then patterned, thereby to remove a portion corresponding to the upper portion of the light receiving region 57 and as a result, forms a light shield conductor film 63.

Figure 5G:
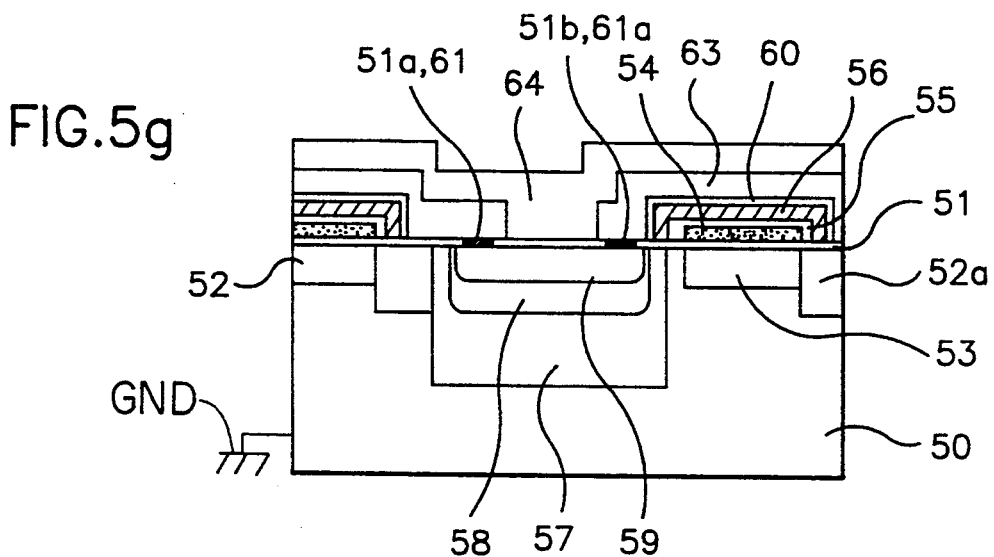

Subsequently, a protection film 64 is formed on the exposed surfaces of the first insulation form 51, the silicide film 61, 61a and the third insulation film 60 using a CVD method, as shown in FIG. 5g.

Herein, the conductor 62 may be made of a metal or a conductive polysilicon.

An insulator may be used as a material for the protection film 64.

According to the present invention, as above mentioned, the following effects can be obtained.

First, the process of making a CCD image sensor can be more simplified, as compared with that of a conventional CCD image sensor.

Second, defects of the p-type silicon substrate can be prevented, since it is not required to anneal the silicon substrate at a high temperature for a long time.

Third, the light sensitivity can be improved, since a higher relative potential is formed at the bulk side of the p-type silicon substrate, as compared with other portions.

Fourth, it is possible to reduce the smear phenomenon due to optical cross-talk, since the light shield conductor film 63 is directly contacted with silicide films 61, 61a.

What is claimed is:

1. A CCD image sensor comprising:
   a semiconductor substrate of a first conductivity type connected to a ground;
   an impurity region of a second conductivity type formed in a surface of the semiconductor substrate of the first conductivity type, to serve as a blooming prevention layer;
   an impurity region of the first conductivity type formed in the surface of the semiconductor substrate, so that it encloses the impurity region of the second conductivity type serving as a blooming prevention layer, to serve as a potential barrier layer;
   an impurity region of the second conductivity type formed in the surface of the semiconductor substrate of the first conductivity type, so that it encloses the impurity region of the first conductivity type serving as a potential barrier layer, to serve as a light receiving region;
   an insulation film which is formed on the surface of the semiconductor substrate of the first conductivity type and has contact holes at both edges of the impurity region of the second conductivity type, serving as a blooming prevention layer;
   silicide films filled in the contact holes; and
   a light shield conductor film which is formed on a surface of the insulation film, except for a portion between the silicide films and the surfaces of the silicide films, and is connected to a voltage source.

2. A CCD image sensor as set forth in claim 1, wherein the first conductivity type is p conductivity type and the second conductivity type is n conductivity type.

3. A CCD image sensor as set forth in claim 1, wherein the impurity region of the second conductivity type serving as a blooming prevention layer has a concentration higher than that of the impurity region of the second conductivity type serving as a light receiving region.

4. A CCD image sensor, as set forth in claim 1, wherein the light shield conductor film is made of either a metal or a conductive polysilicon.

5. A CCD image sensor, as set forth in claim 1, wherein the semiconductor substrate of the first conductivity type is made of silicon.

* * * * *